(12) United States Patent
Brekosky et al.

(10) Patent No.: US 6,431,879 B2
(45) Date of Patent: Aug. 13, 2002

(54) PRINTED CIRCUIT BOARD CONNECTOR

(75) Inventors: Lawrence J. Brekosky, Dillsburg, PA (US); Douglas M. Eakin, Fremont, CA (US); William G. Lenker, Marysville, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 09/780,847

(22) Filed: Feb. 9, 2001

Related U.S. Application Data
(60) Provisional application No. 60/181,593, filed on Feb. 10, 2000.

(51) Int. Cl.[7] ................................................ H05K 1/00
(52) U.S. Cl. ..................... 439/74; 439/66; 439/475; 439/591; 439/710; 361/804; 411/389
(58) Field of Search ......................... 439/74–75, 66, 439/475, 591, 710; 361/804, 296; 411/389, 551, 92

(56) References Cited

U.S. PATENT DOCUMENTS

| | | | | |
|---|---|---|---|---|
| 4,527,312 A | * | 7/1985 | Ruehl et al. .................. 24/453 |
| 4,760,495 A | * | 7/1988 | Till ............................. 361/412 |
| 4,915,641 A | * | 4/1990 | Miskin et al. .............. 439/247 |
| 4,927,787 A | * | 5/1990 | Patel .......................... 439/189 |
| 4,929,185 A | * | 5/1990 | Wong et al. .................. 439/74 |
| 5,013,249 A | * | 5/1991 | Linderman et al. .......... 439/66 |
| 5,677,830 A | * | 10/1997 | Nogas et al. ................ 361/790 |
| 5,754,412 A | * | 5/1998 | Clavin ........................ 361/804 |
| 5,786,989 A | * | 7/1998 | Kawabe ....................... 361/759 |
| 5,956,835 A | * | 9/1999 | Aksu ........................... 29/468 |

\* cited by examiner

*Primary Examiner*—Tho D. Ta
*Assistant Examiner*—Truc Nguyen

(57) ABSTRACT

An electrical connector is shown for stacking a plurality of printed circuit boards one above the other, where some of the terminals extending from the lower portion of the housing include both printed circuit board contacts as well as mating contacts for the next adjacent connector. The connector housing includes integral stand-offs for maintaining the parallel nature of the stacked boards, as well as a precise spacing between the boards. The connector housings can include stand-off members which are frangible and can be used to maintain the parallel nature of the boards when other connector housings of a similar height are not used.

15 Claims, 7 Drawing Sheets

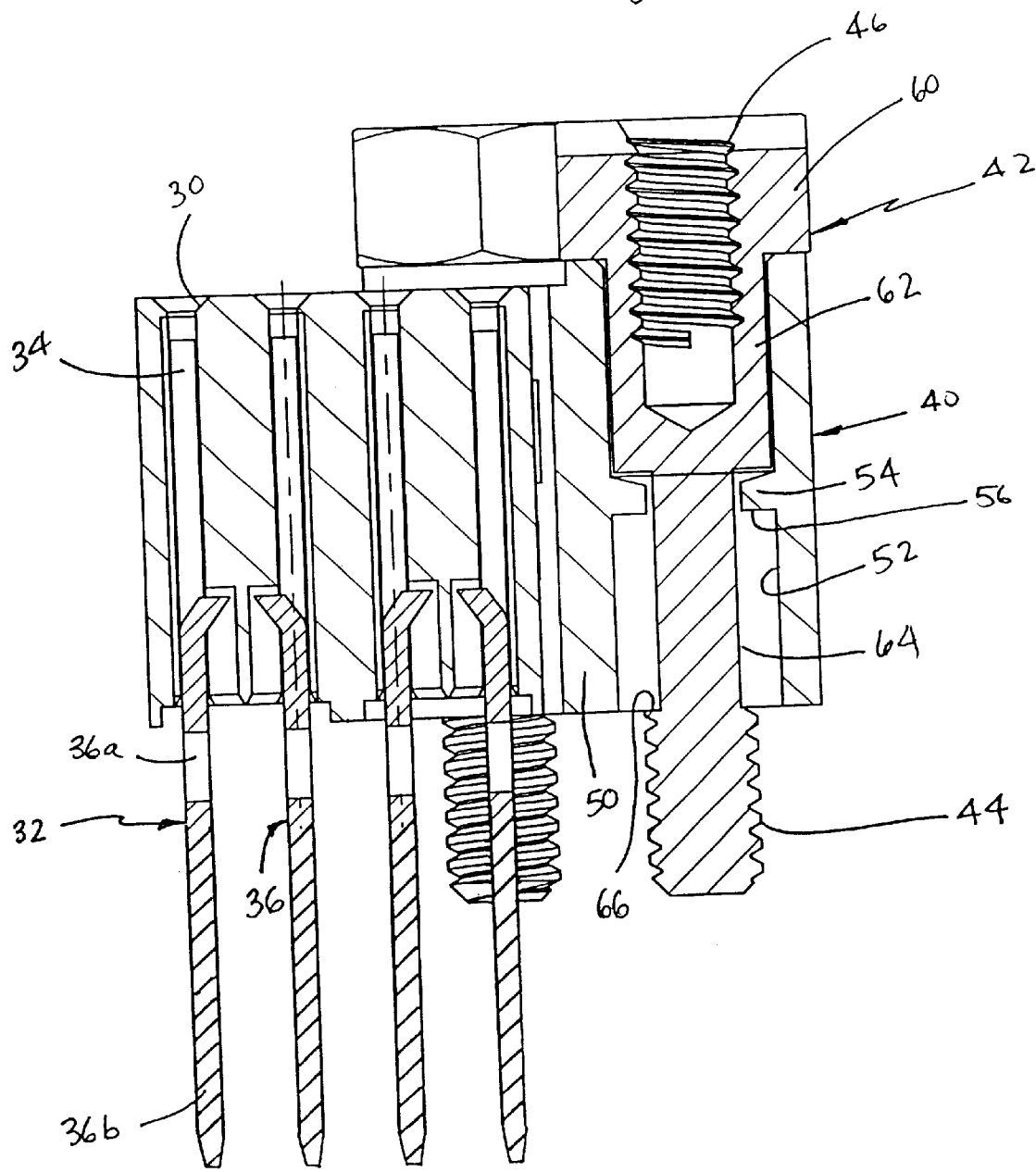

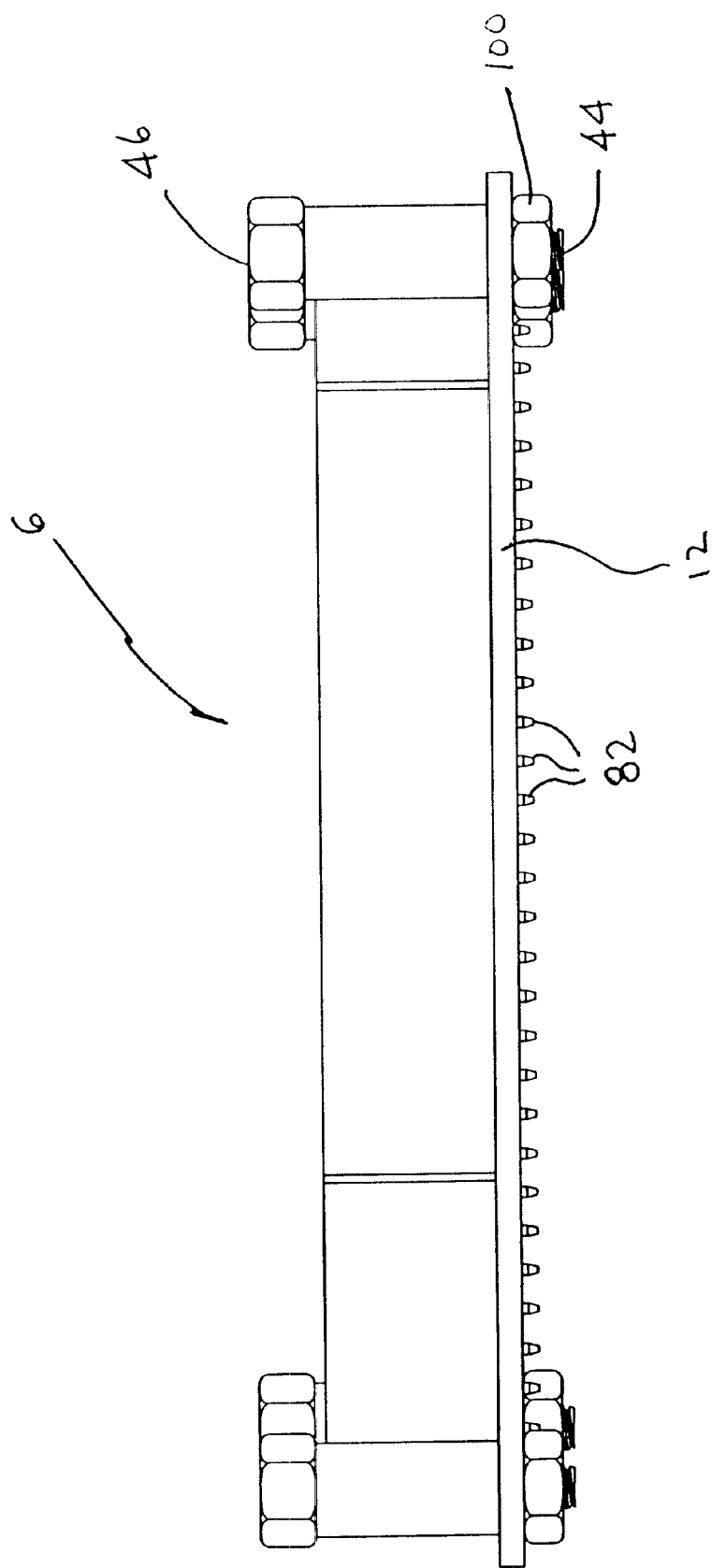

PRINTED CIRCUIT BOARD CONNECTOR

Claims benefit of Provisional Application Ser. No. 60/181,593 filed Feb. 10, 2000.

BACKGROUND OF THE INVENTION

1. Field of the Invention

The present invention relates generally to printed circuit board connectors, and more particularly, to connectors for stacking printed circuit boards at a common height.

2. Discussion of the Prior Art

There are several different computer manufacturing companies, and several different standards relating to various configurations and pin counts in the board designs and/or I/Os. One such standard is the so-called "PC/104" which gets its name from the popular desktop personal computers initially designed by IBM called the PC, and from the number of pins used to connect the cards together (104). PC/104 cards are much smaller than ISA-bus cards found in PCs and stack together to eliminate the need for a motherboard, backplane, and/or card cage. Power requirements and signal drive are reduced to meet the needs of an embedded system. Because PC/104 is essentially a PC with a different form factor, most of the program development tools used for PCs can be used as a PC/104 system. This reduces the cost of purchasing new tools and also greatly reduces the learning curve for programmers and hardware designers.

PC/104 modules are designed to be stacked instead of using a backplane. There is approximately 0.6" between each module. Many designers use off-the-shelf modules for the CPU and other common functions, then create their own module to perform a specific task. When stacked together, a custom controller is created with minimal effort.

Conventional PC/104 modules include at least one connector and a plurality of stand-offs. These stand-offs are discrete items and are assembled onto the boards separately from the connectors. In this manner, stacking the conventional PC/104 modules maintains the distance between the stacked modules.

The objects of the invention are to provide an easier system for the user to assemble, and to inventory.

SUMMARY OF THE INVENTION

The objects of the invention have been accomplished by providing an electrical connector for interconnecting a plurality of printed circuit boards, where the connector comprises an insulative housing having an upper mating face and a lower printed circuit board receiving face. The housing further comprises terminal receiving cavities extending between the faces, with a plurality of terminals therein, the terminals including a mating contact portion adjacent the mating face, and a printed circuit board contact adjacent the lower printed circuit board receiving face. The insulative housing has at least one integral stand-off member to space two boards to be connected at a pre-determined spacing and to fasten them together.

In the preferred embodiment of the invention, the housing has a plurality of stand-off members. The stand-off members are positioned adjacent to ends of the insulative housing. The insulative housing includes permanent stand-off members and frangible stand-off members, whereby said frangible stand-off members may be removed from the housing and used at corners of interconnected printed circuit boards.

Also preferably, the stand-off member comprises a post extending from the housing, with a fastener member extending through the post. The fastener member comprises a first fastener portion extending above the post, and a second fastener portion extending below the post. The first fastener portion comprises a female threaded portion and the second fastener portion comprises a male fastener portion, the first and second fastener portions having a common thread size.

In yet another embodiment of the invention, an electrical connector for interconnecting a plurality of printed circuit boards comprises an insulative housing having an upper mating face and a lower printed circuit board receiving face and terminal receiving cavities extending between the faces. A plurality of terminals are positioned in the cavities, the terminals including a mating contact portion adjacent the mating face, and a printed circuit board contact adjacent the lower printed circuit board receiving face. The insulative housing has at least one attached stand-off member to space two boards to be connected at a pre-determined spacing, the stand-off member including a first fastener portion extending above the housing and a second fastener portion extending below the housing.

In the preferred embodiment of the invention, the stand-off member is integral with the housing. Also preferably, the housing has a plurality of stand-off members. The stand-off members are positioned adjacent to ends of the insulative housing. The connector housing includes permanent stand-off members and frangible stand-off members, whereby the frangible stand-off members may be removed from the housing and used at corners of interconnected printed circuit boards.

Also preferably, at least one stand-off member comprises a post extending from the housing and the stand-off member further comprises a fastener member extending through the post. The fastener member comprises a first fastener portion extending above the post, and a second fastener portion extending below the post. The first fastener portion comprises a female threaded portion and the second fastener portion comprises a male fastener portion, the first and second fastener portions having a common thread size. The fastener member is fixed in the post, but is vertically displaceable to a position where the second fastener portion extends within the post.

BRIEF DESCRIPTION OF THE DRAWINGS

FIG. 7 is a cross sectional view through lines 7—7 of FIG. 6.

FIG. 8 illustrates an elevational view of another embodiment of the connector of the present invention.

DETAILED DESCRIPTION OF THE PREFERRED EMBODIMENT

Figure 1:
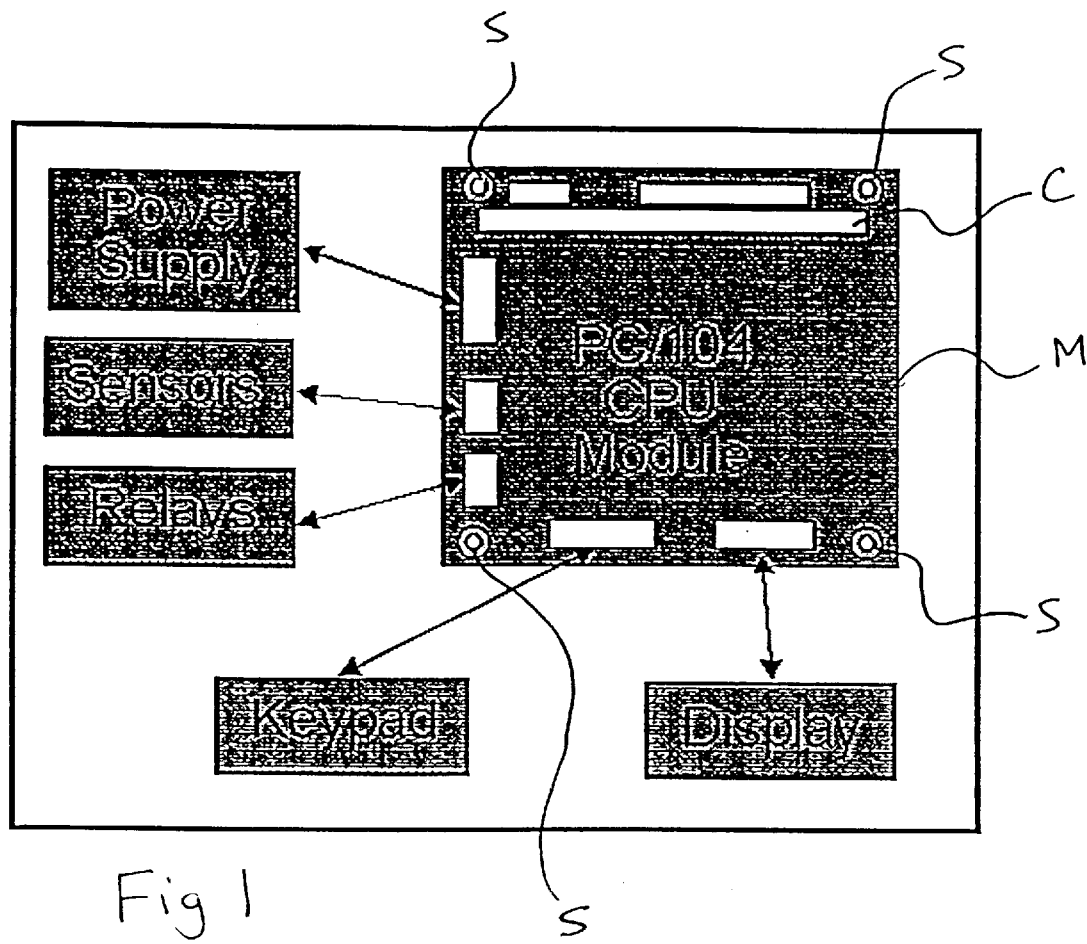
FIG. 1 illustrates a plan view of a conventional PCB connector and separate stand-offs attached to a PCB.
Figure 2:
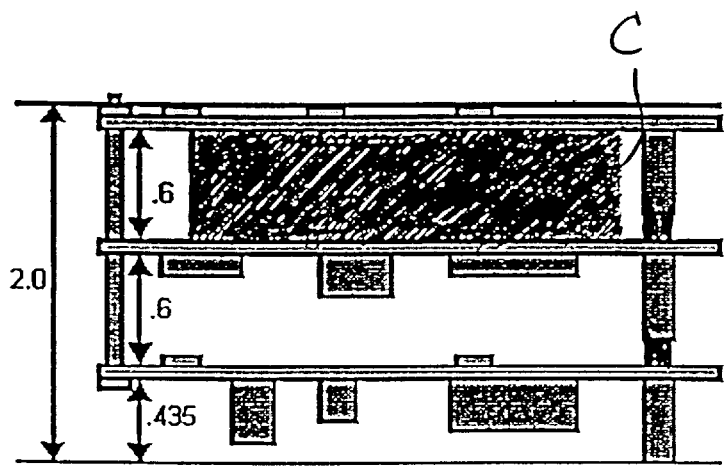
FIG. 2 illustrates an elevational view of a plurality of stacked PCBs having conventional connectors and separate stand-offs.

As illustrated in FIG. 1, conventional PC/104 modules M include at least one connector C and four separate spacers or stand-offs S. The spacers S are separately manufactured items, typically purchased separately from the connectors C and assembled onto the boards separately from the connectors C. As illustrated in FIG. 2, conventional PC/104 modules M may be stacked, having a connector C connecting the module boards and with the spacers S maintaining the distance between the two boards.

Figure 3:
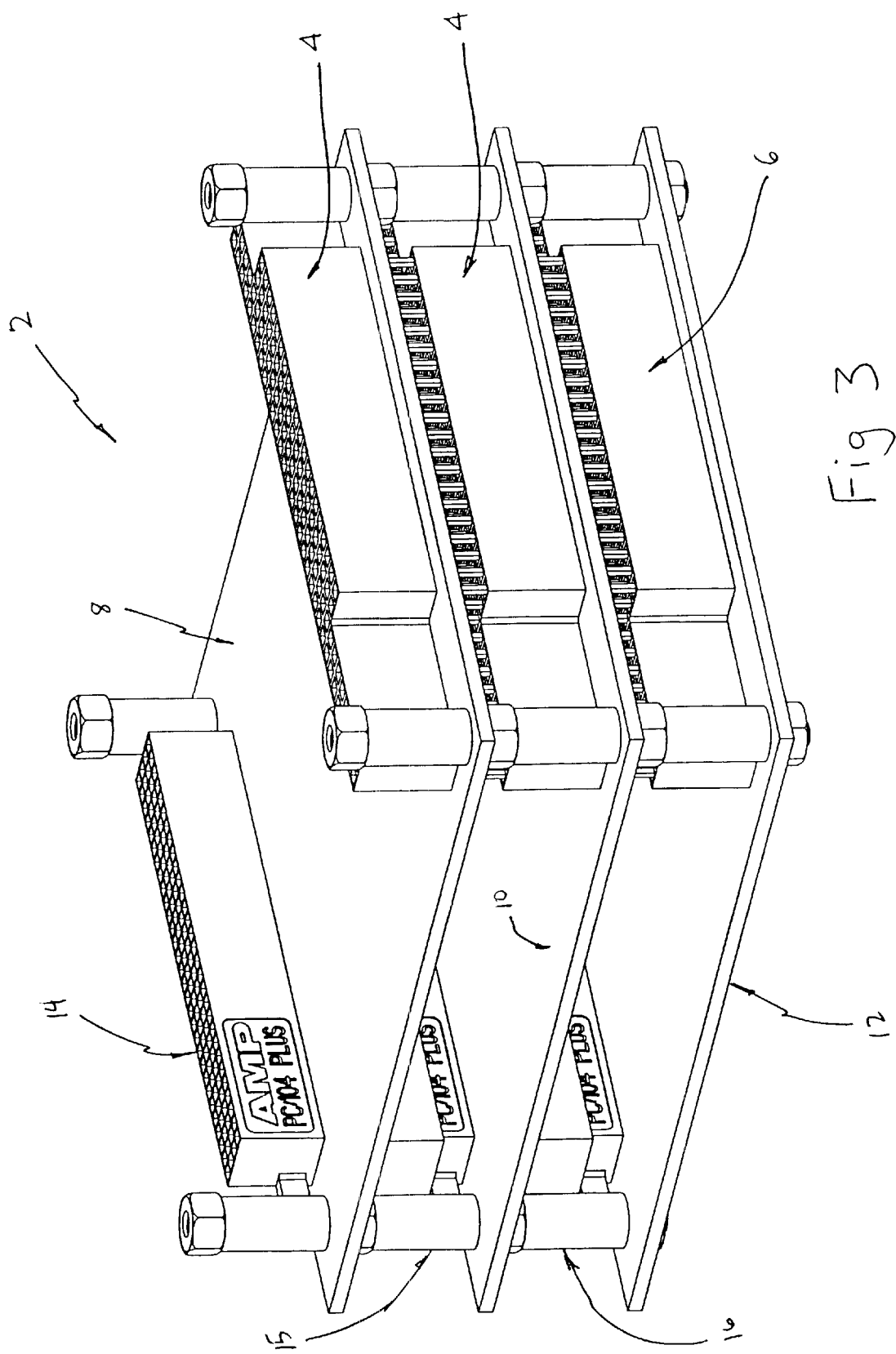
FIG. 3 illustrates a perspective view of a plurality of stacked PCBs interconnected by connectors of the present invention.

The present invention is directed to a board-to-board connector, particularly one configured for use with the PC/104 standard, and that incorporates integral stand-offs. As illustrated in FIG. 3, the printed circuit board assembly is shown generally at 2 and comprises a plurality of electrical connectors 4 together with a lower connector 6. These connectors 4 and 6 stack together and interconnect printed circuit boards 8, 10 and 12 as will be described in detail. The assembly 2 further comprises a plurality of connectors 14, 15 and 16 which may be identical to connectors 4 and 6 or may be of a different design or configuration. However, the overall concept of connectors 14, 15 and 16 is virtually identical to that of connectors 4 and 6.

Figure 4:
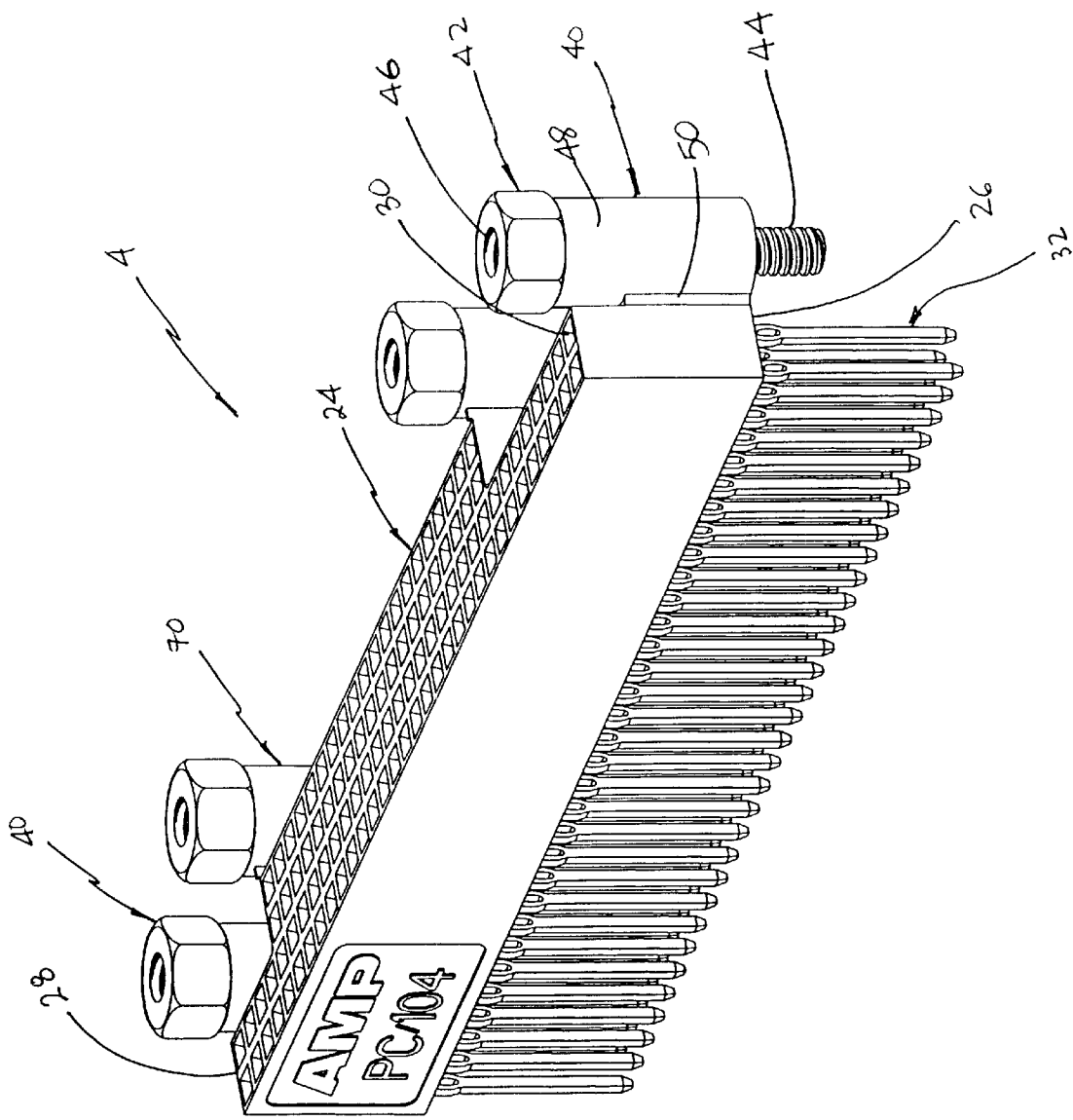
FIG. 4 illustrates a perspective view of a connector of the present invention including integral stand-offs.

As shown in FIG. 4, the connector 4 comprises a housing 24, having a lower board mounting face 26 and a mating face 28. The housing 24 includes a plurality of terminal receiving cavities 30 extending from the mounting face 26 to the mating face 28. The connector 4 also includes a plurality of contacts 32, each partially housed in one of the cavities 30 and partially extending from the mounting face 26. As shown best in FIG. 7, the terminals 32 which extend in the terminal receiving cavities 30 include an upper mating contact portion 34 and printed circuit board contact portions 36. Printed circuit board contact portion 36 is comprised of a compliant portion 36a, as well as a pin portion 36b as will be described herein.

With reference again to FIGS. 4 and 5, the connector 4 also comprises a pair of spacers or stand-offs 40 integrally formed with the housing 6. The spacers 40 and housing 24 are formed from a single mold and positioned according to the PC/104 standard. This eliminates the need for forming the housing 24 and the spacers 40 in separate steps. This also eliminates the need for the board assembler to purchase the connector 4 and stand-offs 40 in separate transactions and mount the connector 4 and stand-off 40 in separate steps.

Each integrated spacer 40 includes captivated hardware for attachment to the board and to a corresponding connector. The spacer 40 generally includes a fastener 42, which in the preferred embodiment is a male screw 44 at one end and a female hex nut 46 at opposite the first end. With reference now to FIGS. 4 and 7, the stand-off 40 is defined as a cylindrical post 48 integrally molded to housing 24 via a thick web of material 50. The cylindrical post includes an internal bore 52 having a constricted portion formed at 54, thereby defining a downwardly facing shoulder at 56. Meanwhile, the fastener member 42 includes an enlarged head portion 60, a reduced diameter shank portion at 62, a further reduced diameter section at 64, which opens into the threaded portion 44. This allows the fastener 42 to be vertically movable upwardly, with the shank portion 64 moving through the constricted portion 54 until a shoulder 66 abuts the downwardly facing shoulder 56.

Figure 5:
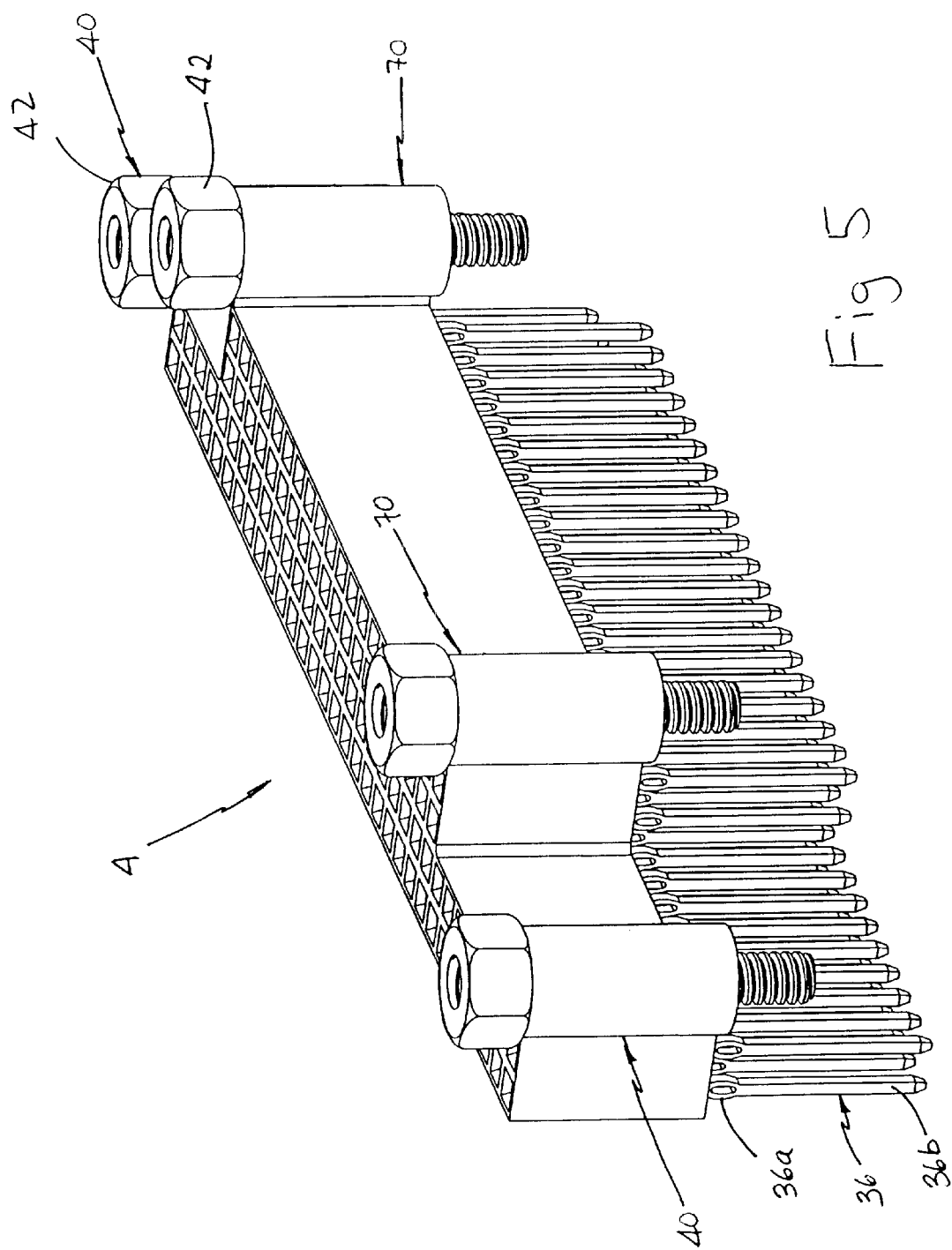
FIG. 5 illustrates another perspective view of the connector of the present invention including integral stand-offs.
Figure 6:
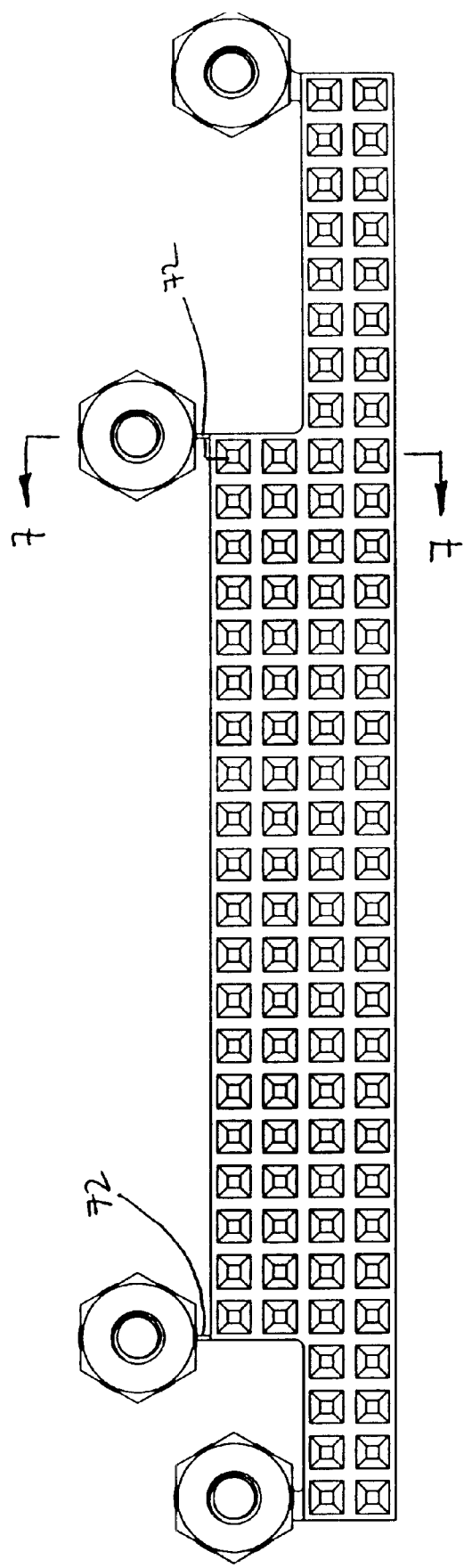
FIG. 6 illustrates a top plan view of the connector of the present invention.

Referring to FIGS. 5–6, in addition to the two spacers 40 that are integrally manufactured and formed with the housing 24, the connector may also include a secondary pair of integrally formed spacers 70. The secondary pair of spacers 70 are identical to the primary pair of spacers in that they include a fastener 42 and a female hex nut 46 for connection to another spacer having a male screw 44. The secondary pair of spacers are formed with a thin web of material 72 which enables the spacers to be snapped off of the housing 4 and attached to an opposite end of the same face of the board 22 if another connector 2 is not to be connected to that end of the board so that stacked boards will remain parallel. This provides the assembler with a single connector with all of the necessary hardware to couple two boards where one of the boards incorporates a single connector 2.

FIG. 8 illustrates an embodiment of the present invention, wherein the contacts 82 are configured for connection to a bottom board 12 in a stacked module configuration, similar to that illustrated in FIG. 3. As such, the portions of the contacts that extend from the housing 24 are much shorter than the contacts in a connector that attaches to an intermediate and/or top module.

FIG. 3 illustrates another embodiment of the present invention, wherein connectors 14–16 are stacked one above the other, and the integral spacers are integrally attached to the connector housings. In this embodiment, the spacer is configured along the longitudinal axis of the housing. The configuration relationship between the spacers and the housing is driven by the number of pin connections of the connector 2 and the PC/104 standard.

With reference now to FIGS. 3 through 8, the assembly of the stacked printed board assembly 2 will be described in greater detail. With reference first to FIG. 8, connector 6 is first positioned on printed circuit board 12, such that pin portions 82, extending through connector 6, align with corresponding through-holes of a printed circuit board of printed circuit board 12. It should be understood that each of the boards 8, 10, 12 have typical circuit board traces and plated through-holes such that pins 82 extend into and through plated through-holes of board 12 for interconnection thereof. As also shown in FIG. 8, male threaded portion 44 will extend through a corresponding unplated through-hole on the printed circuit board with a mechanical fastener such as a nut 100 threadably attached to the male fastener 44 to hold the entire connector 6 to circuit board 12.

Circuit board 10 is now placed on top of connector 6 with corresponding holes in the printed circuit board aligned with female threaded portions 46 of connector 6. A further connector 4 (FIG. 3) is positioned such that the male threaded portions 44 extend through the corresponding through-holes of the printed circuit board 10 and are in alignment with threaded openings 46 of connector 6. As described above with reference to FIG. 7, fastener 42 can float upwardly between the position shown in FIG. 7 to a position where shoulder 66 abuts shoulder 56. This allows the fastener member 42 to float within the post member and not act as a jackscrew. It should also be understood that placement of the connector 4 on the printed circuit board 10 causes pin contact portions 36b to extend beyond the printed circuit board 10 and extend into the corresponding cavities 30 of the connector 6. This places pin portions within the cavities 30 and in mating contact with contact portions 34 in the various cavities. It should be appreciated that this process step can be carried out as many times as necessary for the stacked array of printed circuit boards desired.

The embodiment in FIG. 3 shows connectors having integral stand-off members, but in the event that connectors 14, 15 and 16 do not exist, auxiliary stand-offs 70 can be broken away from the housings by their frangible links 72 (FIG. 6) and be used to space the boards apart so as to maintain the parallel nature between the boards 8, 10, 12.

What we claim is:

1. An electrical connector for interconnecting a plurality of printed circuit boards, said connector comprising an insulative housing having an upper mating face and a lower printed circuit board receiving face, said housing further comprising terminal receiving cavities extending between said faces, said insulative housing having at least two integral stand-off members to space two boards to be connected at a pre-determined spacing and to fasten them together, wherein at least one of the at least two integral stand-off members is permanent and at least one of the at least two integral stand-off members is frangible, whereby the at least one frangible stand-off member may be removed from the housing and used at corners of interconnected printed circuit boards.

2. The connector of claim 1, wherein said stand-off members are positioned adjacent to ends of said insulative housing.

3. The connector of claim 1, wherein each of said at least two stand-off members comprise a post extending from said housing.

4. The connector of claim 3, wherein each of said at least two stand-off members further comprise a fastener member extending through said post.

5. The connector of claim 4, wherein said fastener member comprises a first fastener portion extending above said post, and a second fastener portion extending below said post.

6. The connector of claim 5, wherein said first fastener portion comprises a female threaded portion and said second fastener portion comprises a male fastener portion, said first and second fastener portions having a common thread size.

7. An electrical connector for interconnecting a plurality of printed circuit boards, said connector comprising an insulative housing having an upper mating face and a lower printed circuit board receiving face, said housing further comprising terminal receiving cavities extending between said faces, and having a plurality of terminals therein, said terminals including a mating contact portion adjacent said mating face, and a printed circuit board contact adjacent said lower printed circuit board receiving face, said insulative housing having at least one attached stand-off member to space two boards to be connected at a pre-determined spacing, said stand-off member including a first fastener portion extending above said housing configured to couple said first fastener portion to a fastener portion of an adjacent electrical connector and a second fastener portion extending below said housing configured to couple said second fastener portion to a fastener portion of an adjacent electrical connector.

8. The electrical connector of claim 7, wherein said stand-off member is integral with said housing.

9. The connector of claim 7, wherein said housing has a plurality of stand-off members.

10. The connector of claim 7, wherein said at least one stand-off member comprises a post extending from said housing and said stand-off member further comprises a fastener member extending through said post.

11. The connector of claim 9, wherein said stand-off members are positioned adjacent to ends of said insulative housing.

12. The connector of claim 9, wherein said insulative housing includes permanent stand-off members and frangible stand-off members, whereby said frangible stand-off members may be removed from said housing and used at corners of interconnected printed circuit boards.

13. The connector of claim 10, wherein said fastener member comprises a first fastener portion extending above said post, and a second fastener portion extending below said post.

14. The connector of claim 13, wherein said first fastener portion comprises a female threaded portion and said second fastener portion comprises a male fastener portion, said first and second fastener portions having a common thread size.

15. The connector of claim 14, wherein said fastener member is fixed in said post, but is vertically displaceable to a position where said second fastener portion extends within said post.

* * * * *